US006400419B1

(12) United States Patent
Yamamoto

(10) Patent No.: US 6,400,419 B1
(45) Date of Patent: Jun. 4, 2002

(54) TELEVISION TUNER SYSTEM

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/164,558

(22) Filed: Oct. 1, 1998

(30) Foreign Application Priority Data

Oct. 13, 1997 (JP) .............................................. 9-278461

(51) Int. Cl.$^7$ ................................................. H04N 5/50
(52) U.S. Cl. ........................ 348/731; 348/725; 348/726; 348/727; 455/130; 455/191.1; 455/296; 455/300
(58) Field of Search ................................ 348/731, 725, 348/726, 727, 728; 488/130, 77, 191.1, 217, 283, 296, 299, 300; H04N 5/50

(56) References Cited

U.S. PATENT DOCUMENTS

| | | | | |
|---|---|---|---|---|
| 5,537,292 A | * | 7/1996 | Bowen | 361/737 |
| 5,644,101 A | * | 7/1997 | Elliott | 361/818 |
| 5,974,095 A | * | 10/1999 | Kitaura et al. | 455/106 |
| 6,212,278 B1 | * | 4/2001 | Bacon et al. | 455/186.1 |

FOREIGN PATENT DOCUMENTS

| JP | 405206785 A | * | 8/1993 |
|---|---|---|---|
| JP | 6085700 A | | 3/1994 |
| JP | 6204906 A | | 7/1994 |
| JP | 8162908 A | | 6/1996 |

* cited by examiner

Primary Examiner—John W. Miller
Assistant Examiner—Linus H. Lo
(74) Attorney, Agent, or Firm—Brinks Hofer Gilson & Lione

(57) ABSTRACT

In a television tuner system, a printed board is disposed within a frame having a side plate. A tuner and an intermediate frequency circuit are disposed adjacent to each other on the printed board. The tuner has a mixer and a local oscillator. The intermediate frequency circuit includes at least a SAW filter having a plurality of terminals. A first ground conductor is formed between the tuner and the intermediate frequency circuit. A second ground conductor is formed at a peripheral edge of the printed board. The SAW filter is placed along the second ground conductor in such a manner that the terminals of the SAW filter are arranged substantially parallel to the side plate. The local oscillator is disposed substantially on a line extending from the arrangement of the terminals of the SAW filter. With this arrangement, the distance between the output terminals and the local oscillator is greater than that between the input terminal and the local oscillator. It is thus possible to inhibit local oscillation signals from being accidentally input into the output terminals of the SAW filter, which would otherwise cause the generation of interruption signals, and also to maintain the performance of the SAW filter by preserving its selectivity characteristics.

3 Claims, 2 Drawing Sheets

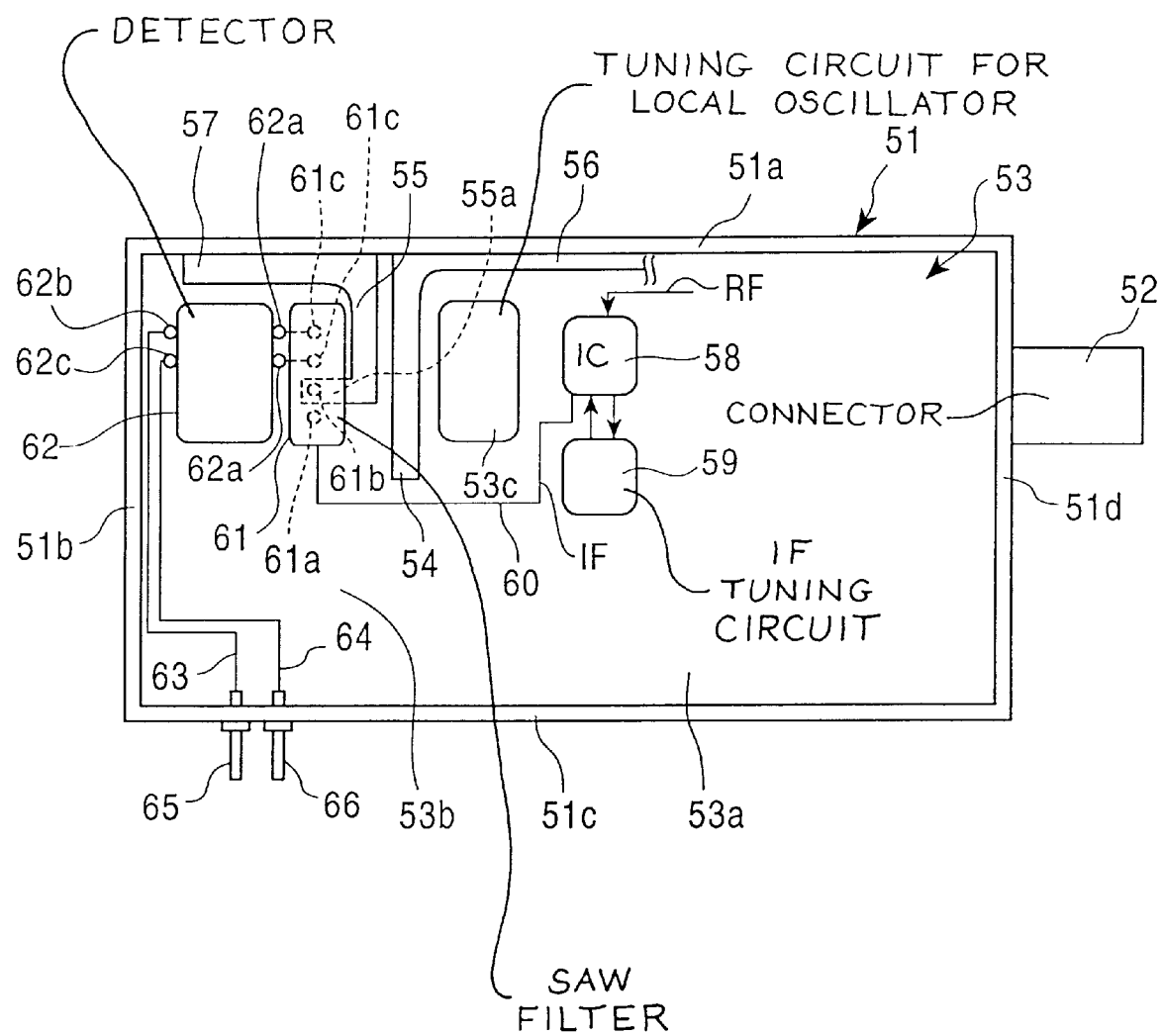

TELEVISION TUNER SYSTEM

BACKGROUND OF THE INVENTION

1. Field of the Invention

The present invention generally relates to television tuner systems and, more particularly, to a circuit layout (arrangement) of a television tuner system.

2. Description of the Related Art

FIG. 3 is a plan view illustrating a circuit layout of a known television tuner system. Referring to FIG. 3, a metallic frame 51 has four side plates 51a, 51b, 51c, and 51d, and a connector 52 for receiving television signals is attached to the side plate 51d of the frame 51. A printed board 53 is disposed within the frame 51. Formed on the printed board 53 are a tuner disposed in a region 53a near the connector 52 and an intermediate frequency circuit in a region 53b away from the connector 52. Ground conductors 54 and 55, which are connected to the frame 51, are formed in parallel to each other at the boundary between the regions 53a and 53b. The ground conductor 54 is formed at the periphery of the region 53a of the printed board 53 and is connected to the frame 51 with a ground conductor 56 connected to the side plate 51a therebetween. The ground conductor 55 is formed at the periphery of the region 53b of the printed board 53 and is connected to the frame 51 with a ground conductor 57 connected to the side plate 51a therebetween.

In the region 53a where the tuner is formed, there are disposed not only a high frequency amplifier and a tuning circuit, both of which are not shown, but also a mixer, a local oscillator, and an intermediate frequency amplifier. The mixer, the local oscillator, and the intermediate frequency amplifier are integrated into an integrated circuit (IC) component 58 within a single package. A tuning circuit connected to the local oscillator within the IC component 58 is disposed in a region 53c adjacent to the ground conductor 54. The IC component 58 is placed in proximity with the region 53c.

With the above arrangement, television signals input into the connector 52 are amplified in the high frequency amplifier (not shown), and a television signal RF of a desired channel is selected in the tuning circuit (not shown). The television signal RF is then input into the mixer within the IC component 58. In the mixer, the television signal RF is mixed with an oscillation signal output from the local oscillator and is converted into an intermediate frequency signal. The intermediate frequency signal is temporarily extracted from the IC component 58 and input into an intermediate frequency tuning circuit 59 formed on the printed board 53, and again returns to the intermediate frequency amplifier formed within the IC component 58. The intermediate frequency signal is amplified in the intermediate frequency amplifier, and the amplified signal IF is then output via a conductor pattern 60 formed on the printed board 53 to the intermediate frequency circuit disposed in the region 53b.

A surface acoustic wave (SAW) filter 61 and a detector 62 are provided for the intermediate frequency circuit in the region 53b. The SAW filter 61 is formed generally in a rectangular prism shape and has a plurality of terminals, such as an input terminal 61a, a ground terminal 61b, and output terminals 61c and 61c, which are sequentially aligned and project in the same direction from one side of the SAW filter 61. The SAW filter 61 is placed in proximity with the ground conductor 55 in such a manner that the terminals 61a, 61b, 61c and 61c are aligned parallel to the ground conductor 55 and that the output terminals 61c and 61c are placed near the ground conductor 57. In this state, the input terminal 61a is connected to the conductor pattern 60, and the ground terminal 61b is connected to a ground conductor portion 55a projecting from the ground conductor 55.

The detector 62 is also formed generally in a rectangular prism shape as an IC component. Intermediate frequency signal input terminals 62a and 62a, and detector output terminals 62b and 62c project from the respective two sides of the detector 62. The detector 62 and the SAW filter 61 are placed side by side in such a manner that the intermediate frequency signal input terminals 62a and 62a face the SAW filter 61. The output terminals 61c and 61c of the SAW filter 61 are respectively connected to the intermediate frequency signal input terminals 62a and 62a of the detector 62 with conductor patterns (not shown). The detector output terminals 62b and 62c are respectively connected via conductor patterns 63 and 64 to terminals 65 and 66 attached to the side plate 51c of the frame 51.

An intermediate frequency signal input into the input terminal 61a of the SAW filter 61 is provided with predetermined selectivity characteristics in the SAW filter 61, and the balanced signals are output from the output terminals 61c and 61c. The balanced signals are then input into the intermediate frequency signal input terminals 62a and 62a of the detector 62 and are detected by the detector 62, thereby extracting a video signal V and a sound signal S.

However, the above conventional television tuner system presents the following problems.

The SAW filter 61 is located on the printed board 53 in such a manner that the terminals 61a, 61b, 61c and 61c are aligned substantially parallel to the two ground conductors 54 and 55 formed at the boundary of the two regions 53a and 53b of the printed board 53. Accordingly, the output terminals 61c and 61c, as well as the input terminal 61a, of the SAW filter 61 are placed in proximity with the local oscillator (which is integrated within the IC component 58) disposed in the region 53a. Thus, an oscillation signal output from the local oscillator may be accidentally input into the output terminals 61c and 61c of the SAW filter 61, and the level of the signal is accordingly increased. The oscillation signal is then input into the detector 62. Since the detector 62 is provided with a voltage controlled oscillator for synchronous detection, an unwanted interruption signal (beat signal) is generated due to the local oscillation signal from the detector 62 and the oscillation signal from the voltage controlled oscillator.

The ground terminal 61b of the SAW filter 61 is connected to the frame 51 with the ground conductor portion 55a therebetween, thereby increasing the distance from the ground terminal 61b to the frame 51. According, the grounding effect of the ground terminal 61b is impaired. Thus, the selectivity characteristics of the SAW filter 61 are lowered, thereby failing to sufficiently attenuate the band in an adjacent channel.

SUMMARY OF THE INVENTION

Accordingly, it is an object of the present invention to inhibit a local oscillation signal from being accidentally input into output terminals of a SAW filter, which would otherwise cause the generation of interruption signals, and also to maintain the performance of the SAW filter by preserving its selectivity characteristics.

In order to achieve the above object, according to the present invention, there is provided a television tuner system including a printed board disposed in a metallic frame having a side plate. A tuner has a mixer and a local oscillator and converts a received television signal into an intermediate frequency signal. An intermediate frequency circuit has at least a SAW filter and detects the intermediate frequency signal output from the tuner. The tuner and the intermediate frequency circuit are arranged adjacent to each other on the printed board. A first ground conductor is connected to the frame and is disposed on the printed board between the tuner and the intermediate frequency circuit in such a manner that it is disposed substantially perpendicular to the side plate. A second ground conductor is connected to the frame and is disposed along the side plate at a peripheral edge of the printed board corresponding to the position of the intermediate frequency circuit. The SAW filter has at least an input terminal and an output terminal, which are aligned in a row and project in the same direction. The SAW filter is placed along the second ground conductor in such a manner that the terminals are disposed substantially parallel to the side plate of the frame. The local oscillator is disposed substantially on a line extending from the arrangement of the terminals, so that a distance between the output terminal and the local oscillator is greater than a distance between the input terminal and the local oscillator.

According to the aforementioned television tuner system, the SAW filter may include a ground terminal between the input terminal and the output terminal. A third ground conductor may be provided on the printed board in such a manner that it is connected to the second ground conductor and extends to an inward portion of the frame. Thus, the ground terminal may be connected to the third ground conductor.

Further, the intermediate frequency circuit may include a detector for detecting the intermediate frequency signal output from the SAW filter. A fourth ground conductor, which is connected to the frame, may be formed at a peripheral edge of the printed board corresponding to the position of the intermediate frequency circuit along a plate adjacent to the side plate. Thus, the first ground conductor, the second ground conductor, and the fourth ground conductor may be formed in an angular U-shape, and the detector and the SAW filter may be, as a whole, placed side by side.

Further, the detector may include an intermediate frequency signal input terminal and a detector output terminal, which project in opposite directions. A fifth ground conductor may be disposed on the printed board in such a manner that it is connected to the fourth ground conductor and extends to an inward portion of the frame. The detector and the SAW filter may be placed side by side on the printed board in such a manner that the intermediate frequency signal input terminal faces the SAW filter. Thus, the fifth ground conductor may be positioned between the intermediate frequency signal input terminal and the detector output terminal.

In addition, the second ground conductor may be connected to the frame at a position corresponding to a portion of the third ground conductor projecting from the second ground conductor. The fourth ground conductor may be connected to the frame at a position corresponding to a portion of the fifth ground conductor projecting from the fourth ground conductor.

BRIEF DESCRIPTION OF THE DRAWINGS

FIG. 3 is a plan view illustrating a conventional television tuner system.

DESCRIPTION OF THE PREFERRED EMBODIMENT

A television tuner system of the present invention is described hereinbelow to illustrate a preferred embodiment with reference to FIGS. 1 and 2.

Figure 1:
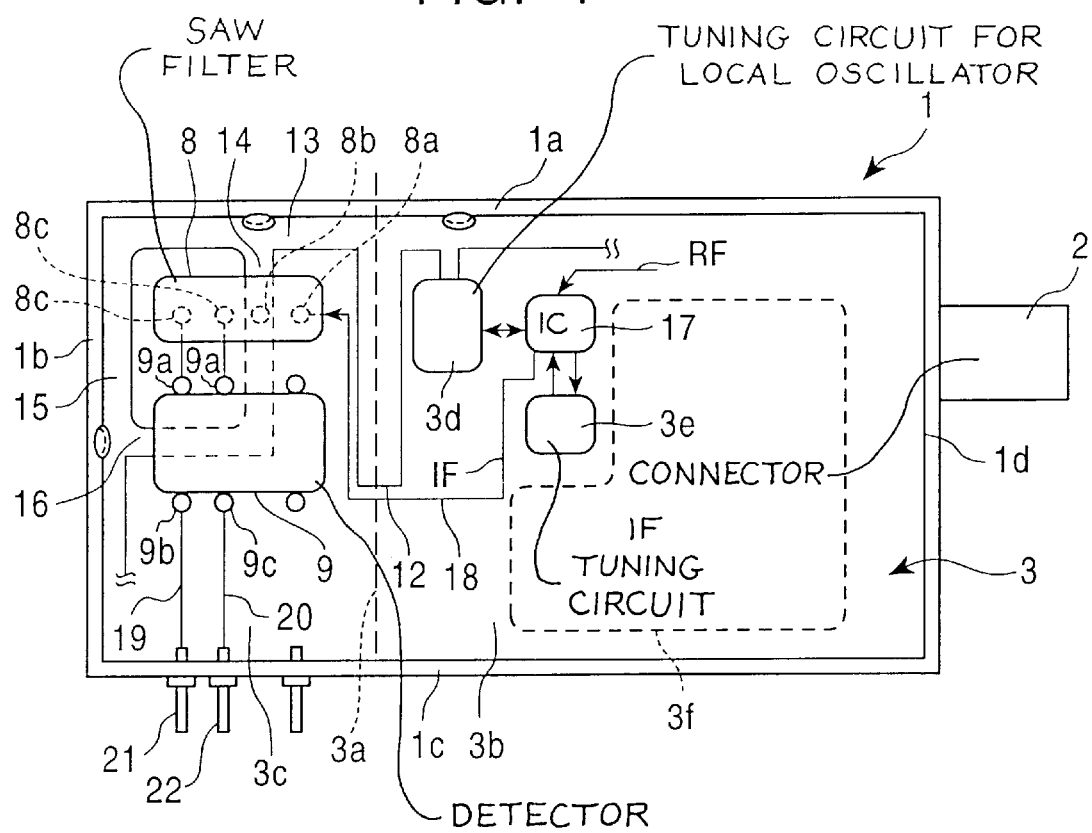
FIG. 1 is a plan view illustrating a television tuner system according to the present invention.
Figure 2:
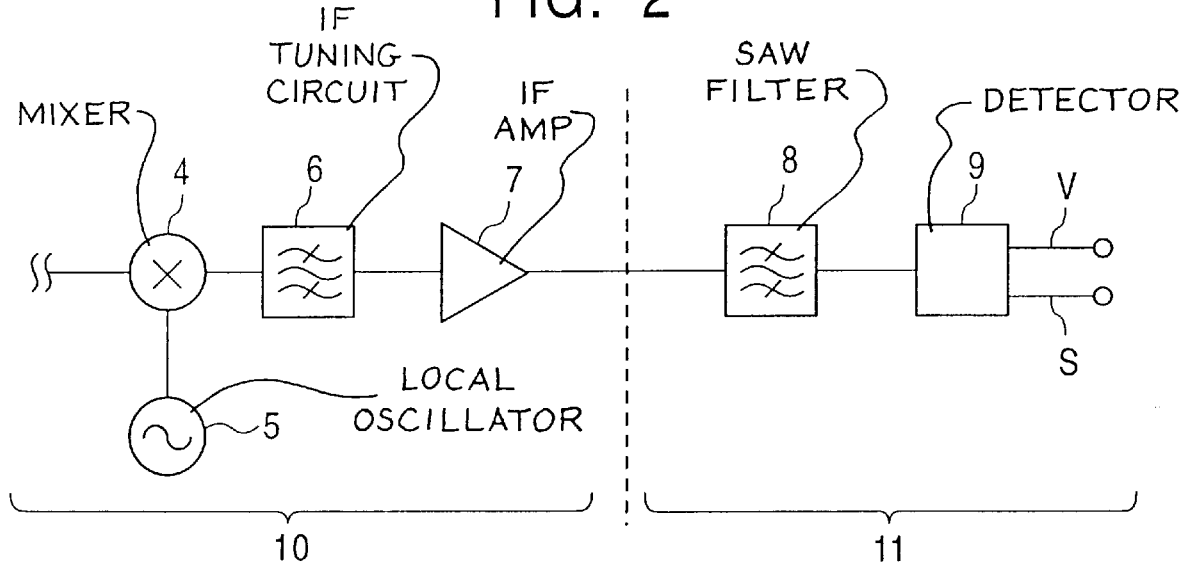
FIG. 2 is a block diagram partially illustrating a television tuner system according to the present invention.

Referring to the plan view illustrating the circuit layout of a television tuner system of the present invention shown in FIG. 1, a metallic frame 1 has four side plates 1a, 1b, 1c, and 1d, and a connector 2 for receiving television signals is attached to the side plate 1d of the frame 1. A printed board 3 is disposed within the frame 1. In the printed board 3, a first region 3b and a second region 3c are partitioned by a virtual line of boundary 3a which is disposed parallel to the side plate 1d and substantially perpendicular to the side plate 1a. A tuner is formed in the first region 3b in the vicinity of the connector 2, while an intermediate frequency circuit is formed in the second region 3c away from the connector 2.

The tuner and the intermediate frequency circuit are described in detail with reference to the block diagram partially illustrating the television tuner system of the present invention shown in FIG. 2. Among television signals incorporated into an input connector (see the connector 2 of FIG. 1) of a television tuner system, a television signal of a desired channel is selected in a high frequency tuning circuit (not shown) and amplified in a high frequency amplifier (not shown). The television signal is then input into a mixer 4 where it is mixed with a local oscillation signal output from a local oscillator 5 and is converted into an intermediate frequency signal. The television signal then passes through an intermediate frequency tuning circuit 6 and is input into an intermediate frequency amplifier 7 where the signal is amplified to a required level. Subsequently, the television signal is provided with desired selectivity characteristics in a SAW filter 8, and a video signal V and a sound signal S are extracted in a detector 9. The detector 9 is provided with a voltage controlled oscillator (not shown) for synchronous detection.

With the above-described configuration, the mixer 4, the local oscillator 5, the intermediate frequency tuning circuit 6, and the intermediate frequency amplifier 7 form a tuner 10 together with the high frequency amplifier and the high frequency tuning circuit (not shown). The tuner 10 is disposed in the first region 3b of the printed board 3 illustrated in FIG. 1. In the present invention, the mixer 4, the local oscillator 5 (only a transistor circuit), and the intermediate frequency amplifier 7 are integrated into an IC component.

The SAW filter 8 and the detector 9 form an intermediate frequency circuit 11, which is disposed in the second region 3c of the printed board 3.

Referring back to FIG. 1, a first ground conductor 12 is formed on the printed board 3 along the virtual line of boundary 3a between the first region 3b and the second region 3c. The first ground conductor 12 extends from the vicinity of the side plate 1a adjacent to the side plate 1d to the vicinity of the central portion of the printed board 3. A second ground conductor 13 is formed along the side plate 1a at the periphery of the second region 3c of the printed board 3, the conductor 13 being connected to the side plate 1a by means such as soldering. The second ground conductor 13 extends to the first region 3b along the side plate 1a. A third ground conductor 14 is also formed in the second region 3c in such a manner that it is placed substantially parallel to the first ground conductor 12 and projects from the second ground conductor 13 to the inward portion of the frame 1. A fourth ground conductor 15 is formed along the side plate 1b adjacent to the side plate 1a in the second region 3c of the printed board 3, the conductor 15 being connected to the side plate 1b.

With this configuration, the first ground conductor 12, the second ground conductor 13, and the fourth ground conductor 15 are, as a whole, formed in an angular U-like shape. A fifth ground conductor 16 is further formed in the second region 3c substantially parallel to the second ground conductor 13 in the second region 3c in such a manner that it projects from the fourth ground conductor 15 to the inward portion of the frame 1. The fifth ground conductor 16 is connected to the third ground conductor 14. As a consequence, a closed loop is formed by the second ground conductor 13, the third ground conductor 14, the fourth ground conductor 15, and the fifth ground conductor 16.

The second ground conductor 13 is soldered to the side plate 1a at a position corresponding to the portion of the third ground conductor 14 projecting from the second ground conductor 13. The fourth ground conductor 15 is soldered to the side plate 1b adjacent to the side plates 1a and 1c at a position corresponding to the portion of the fifth ground conductor 16 projecting from the fourth ground conductor 15.

In the first region 3b of the printed board 3, components, such as a coil and a capacitor, of a tuning circuit used for the local oscillator 5 are formed in a region 3d in the vicinity of the first ground conductor 12. An integrated circuit (IC) component 17 integrating the mixer 4, the local oscillator 5, and the intermediate frequency amplifier 7 (shown in FIG. 2) is disposed near the region 3d. The intermediate frequency tuning circuit 6 (shown in FIG. 2) is formed in a region 3e in the vicinity of the IC component 17. The high frequency amplifier and the high frequency tuning circuit, both of which are not shown, are disposed in a region 3f within the first region 3b.

Television signals input into the connector 2 are amplified in the high frequency amplifier, and a television signal RF of a desired channel is selected in the high frequency tuning circuit and is then input into the mixer 4 (shown in FIG. 2) of the IC component 17. In the mixer 4, the television signal RF is mixed with an oscillation signal output form the local oscillator 5 (shown in FIG. 2) within the IC component 17 and is converted into an intermediate frequency signal. The intermediate frequency signal is temporarily extracted from the IC component 17 and is input into the intermediate frequency tuning circuit 6 (illustrated in FIG. 2) formed in the region 3e of the printed board 3. The intermediate frequency signal then returns to the intermediate frequency amplifier 7 (illustrated in FIG. 2) within the IC component 17. The signal is amplified to an intermediate frequency signal IF in the intermediate frequency amplifier 7 and is input into the intermediate frequency circuit 11 formed in the second region 3c via a conductor pattern 18 disposed on the printed board 3.

In the second region 3c, the SAW filter 8 and the detector 9 are disposed to form the intermediate frequency circuit 11. The SAW filter 8 is formed generally in a rectangular prism shape and has a plurality of terminals, such as an input terminal 8a, a ground terminal 8b, and output terminals 8c and 8c, which are sequentially aligned and project in the same direction from one side of the SAW filter 8. The reason for providing the two output terminals 8c and 8c is to extract balanced signals. The SAW filter 8 is placed in proximity with the second ground conductor 13 in such a manner that the terminals 8a, 8b, 8c and 8c are aligned substantially parallel to the second ground conductor 13. Additionally, the input terminal 8a is arranged in the vicinity of the first ground conductor 12, while the output terminals 8c and 8c are arranged near the fourth ground conductor 15. With this arrangement, the IC component 17 integrating the local oscillator 5 and the region 3d where the tuning circuit used for the local oscillator 5 is disposed are positioned in such a manner that they extend from the arrangement of the terminals 8c, 8c, 8b, and 8a of the SAW filter 8. Accordingly, the output terminals 8c and 8c are located away from the IC component 17 integrating the local oscillator 5 and the tuning circuit used for the local oscillator 5 disposed in the region 3d. The third ground conductor 14 is formed to reach the ground terminal 8b of the SAW filter 8 and is connected to the ground terminal 8b. The second ground conductor 13 is connected to the side plate 1a by means such as soldering at a position corresponding to the portion of the third ground conductor 14 projecting from the second ground conductor 13, thereby enhancing the grounding effect of the ground terminal 8b of the SAW filter 8. Accordingly, the selectivity characteristics of the SAW filter 8 are improved, and isolation between the input terminal 8a and the output terminals 8c and 8c is increased.

The detector 9, as well as the SAW filter 8, is formed generally in a rectangular prism shape as an IC component, and intermediate frequency signal input terminals 9a and 9a and detector output terminals 9b and 9c project from the respective two sides of the detector 9. A video signal V and a sound signal S are output from the detector output terminals 9b and 9c, respectively.

The detector 9 and the SAW filter 8 are placed side by side in such a manner that the intermediate frequency signal input terminals 9a and 9a face the SAW filter 8. Accordingly, the detector output-terminals 9b and 9c of the detector 9 face the side plate 1c. With this configuration, the fifth ground conductor 16 is positioned between the intermediate frequency signal input terminals 9a and 9a and the detector output terminals 9b and 9c. The fourth conductor terminal 15 is soldered to the side plate 1b at a position corresponding to the portion of the fifth ground conductor 16 projecting from the fourth ground conductor 15, thereby improving isolation between the input terminals 9a and 9a and the output terminals 9b and 9c. The output terminals 8c and 8c of the SAW filter 8 are respectively connected to the intermediate frequency signal input terminals 9a and 9a of the detector 9 with conductor patterns (not shown). The detector output terminals 9b and 9c are respectively connected via conductor patterns 19 and 20 to tuner output terminals 21 and 22 attached to the side plate 1c adjacent to the side plate 1d.

The intermediate frequency signal input into the input terminal 8a of the SAW filter 8 is provided with predetermined selectivity characteristics in the SAW filter 8, and the balanced signals are output from the output terminals 8c and 8c. The balanced signals are then input into the intermediate frequency signal input terminals 9a and 9a of the detector 9 and are detected by the detector 9, thereby extracting a video signal V and a sound signal S.

As is seen from the foregoing description, the television tuner of the present invention offers the following advantages.

According to the television tuner system, a printed board is disposed within a metallic frame having a side plate. A tuner and an intermediate frequency circuit which has at least a SAW filter and detects the intermediate frequency signal output from the tuner are arranged adjacent to each other on the printed board. A first ground conductor is disposed on the printed board between the tuner and the intermediate frequency circuit. A second ground conductor is connected to the frame and is disposed along the side plate at a peripheral edge of the printed board corresponding to the position of the intermediate frequency circuit. The SAW filter has at least an input terminal and output terminals, which are aligned in a row and project in the same direction. The SAW filter is placed along the second ground conductor in such a manner that the terminals are disposed substantially parallel to the side plate of the frame. The local oscillator is disposed substantially on a line extending from the arrangement of the terminals, so that a distance between the output terminals and the local oscillator is greater than a distance between the input terminal and the local oscillator. With the above-mentioned arrangement, the level of oscillation signals inadvertently input into the output terminals of the SAW filter from the local oscillator is lowered, thereby suppressing interruption signals generated in the detector.

The SAW filter includes a ground terminal between the input terminal and the output terminals. A third ground conductor is provided on the printed board in such a manner that it is connected to the second ground conductor and extends to an inward portion of the frame. Accordingly, the ground terminal is connected to the third ground conductor. With the above-mentioned configuration, isolation between the input terminal and the output terminals of the SAW filter is increased, which improves the selectivity characteristics of the SAW filter, thereby increasing the attenuation of the band in an adjacent channel.

The intermediate frequency circuit includes a detector for detecting the intermediate frequency signal output from the SAW filter. A fourth ground conductor, which is connected to the frame, is formed at a peripheral edge of the printed board corresponding to the position of the intermediate frequency circuit along a plate adjacent to the above side plate. Thus, the first ground conductor, the second ground conductor, and the fourth ground conductor are, as a whole, formed in an angular U-shape, and the detector and the SAW filter are placed side by side. Accordingly, the SAW filter and the detector are surrounded by the ground conductors formed in an angular U-shape, thereby further inhibiting oscillation signals from being input into the output terminals of the SAW filter from the local oscillator.

The detector includes an intermediate frequency signal input terminal and detector output terminals, which project in opposite directions. A fifth ground conductor is disposed on the printed board in such a manner that it is connected to the fourth ground conductor and extends to an inward portion of the frame. The detector and the SAW filter are placed side by side on the printed board in such a manner that the intermediate frequency signal input terminal faces the SAW filter. Accordingly, the fifth ground conductor is positioned between the intermediate frequency signal input terminal and the detector output terminals. Thus, isolation between the input terminal and the output terminals of the detector is increased, thereby preventing leakage of oscillation signals into the tuner output terminals. Since the detector output terminals face a plate to which the tuner output terminals are attached, the detector output terminals and the tuner output terminals can be connected with a minimal distance, thereby reducing the space on the printed board to a smaller level.

The second ground conductor is connected to the frame at a position corresponding to a portion of the third ground conductor projecting from the second ground conductor. The fourth ground conductor is connected to the frame at a position corresponding to a portion of the fifth ground conductor projecting from the fourth ground conductor. Accordingly, the third ground conductor and the fifth ground conductor can be connected with a minimal distance, thereby further enhancing isolation between the input terminal and the output terminals of the SAW filter and between the input terminal and the output terminals of the detector.

What is claimed is:

1. A television tuner system comprising:

a printed board disposed in a metallic frame having a side plate;

a tuner comprising a mixer and a local oscillator, to convert a received television signal into an intermediate frequency signal;

an intermediate frequency circuit including at least a surface acoustic wave filter, the intermediate frequency circuit to detect the intermediate frequency signal output from the tuner, the tuner and the intermediate frequency circuit being arranged adjacent to each other on the printed board;

a first ground conductor connected to the frame and disposed on the printed board between the tuner and the intermediate frequency circuit and disposed substantially perpendicular to the side plate;

a second ground conductor connected to the frame and disposed at a peripheral edge of the printed board corresponding to the position of the intermediate frequency circuit along the side plate; and a third ground conductor provided on the printed board, connected with the second ground conductor and extending to an inward portion of the frame, wherein the surface acoustic wave filter has at least an input terminal and an output terminal, which are aligned in a row and project in the same direction, and a ground terminal disposed between the input terminal and the output terminal and being connected to the third ground conductor, the surface acoustic wave filter being disposed along the second ground conductor such that the input and output terminals are disposed substantially parallel to the side plate of the frame, wherein the local oscillator is disposed substantially on a line extending from the input and output terminals such that a distance between the output terminal and the local oscillator is greater than a distance between the input terminal and the local oscillator, wherein said intermediate frequency circuit comprises a detector to detect the intermediate frequency signal output from said surface acoustic wave filter, and a fourth ground conductor, connected to said frame, is formed at a peripheral edge of said printed board corresponding to the position of said intermediate frequency circuit along a plate adjacent to said side plate, whereby said first ground conductor, said second ground conductor, and said fourth ground conductor are formed in an angular U-shape with the output terminal of the surface-acoustic wave filter and an input terminal of the detector being disposed within the U-shape, and said detector and said surface acoustic wave filter are placed side by side.

2. A television tuner system according to claim 1, wherein said detector comprises an intermediate frequency signal input terminal and a detector output terminal, which project in opposite directions, and a fifth ground conductor is disposed on said printed board so as to be connected to said fourth ground conductor and to extend to an inward portion of said frame, said detector and said surface acoustic wave filter being placed side by side on said printed board in such a manner that said intermediate frequency signal input terminal of the detector faces said surface acoustic wave filter, whereby said fifth ground conductor is positioned between said intermediate frequency signal input terminal and said detector output terminal.

3. A television tuner system according to claim 2, wherein said second ground conductor is connected to said frame at a position corresponding to a portion of said third ground conductor projecting from said second ground conductor, and said fourth ground conductor is connected to said frame at a position corresponding to a portion of said fifth ground conductor projecting from said fourth ground conductor.

* * * * *

UNITED STATES PATENT AND TRADEMARK OFFICE
CERTIFICATE OF CORRECTION

PATENT NO. : 6,400,419 B1  
DATED : June 4, 2002  
INVENTOR(S) : Masaki Yamamoto It is certified that error appears in the above-identified patent and that said Letters Patent is hereby corrected as shown below:

<u>Title page,</u>  
Item [56], FOREIGN PATENT DOCUMENTS, insert the following:

-- EP 0 130 427 A    9/1985    EPO  
       EP 0 186 593 A    2/1986    EPO --.

<u>Column 8,</u>  
Line 60, delete "surface-acoustic" and substitute -- surface acoustic -- in its place.

Signed and Sealed this

Twenty-ninth Day of July, 2003

JAMES E. ROGAN  
*Director of the United States Patent and Trademark Office*